(12) United States Patent
King

(10) Patent No.: US 8,134,397 B2
(45) Date of Patent: Mar. 13, 2012

(54) MINIMUM LEADING EDGE BLANKING SIGNAL GENERATOR AND METHOD FOR GENERATING MINIMUM LEADING EDGE BLANKING SIGNAL

(75) Inventor: Shih-Chieh King, Xindian (TW)

(73) Assignee: Linear Artwork, Inc., Taipei County (TW)

( * ) Notice: Subject to any disclaimer, the term of this patent is extended or adjusted under 35 U.S.C. 154(b) by 40 days.

(21) Appl. No.: 12/885,443

(22) Filed: Sep. 18, 2010

(65) Prior Publication Data

US 2011/0068830 A1 Mar. 24, 2011

(30) Foreign Application Priority Data

Sep. 21, 2009 (TW) .............................. 98131755 A

(51) Int. Cl.
*G06F 1/04* (2006.01)
(52) U.S. Cl. ........................................ 327/291; 327/172
(58) Field of Classification Search ........................ None
See application file for complete search history.

(56) References Cited

U.S. PATENT DOCUMENTS 7,821,750 B2 * 10/2010 Chu et al. ......................... 361/18
7,880,522 B2 * 2/2011 Ouyang et al. ................. 327/172

* cited by examiner

*Primary Examiner* — An Luu

(57) ABSTRACT

A minimum leading edge blanking (MLEB) signal generator is provided. The MLEB signal generator includes a buck unit and a signal generation unit. The buck unit receives an error amplification signal, and generates a reference blanking signal. The reference blanking signal has a voltage lower than a voltage of the error amplification signal. The signal generation unit receives the reference blanking signal, and generates the MLEB signal according to the current sensing signal. When the current sensing signal is equal to the reference blanking signal, the MLEB signal changes its voltage level. As such, the width of the MLEB signal is a time width of the high level or low level of the MLEB signal before the voltage level of the MLEB signal changes. The MLEB is provided to an external unit, such that the external unit can be prevented from misoperation, thus improving the electric performance in its entirety.

8 Claims, 6 Drawing Sheets

MINIMUM LEADING EDGE BLANKING SIGNAL GENERATOR AND METHOD FOR GENERATING MINIMUM LEADING EDGE BLANKING SIGNAL

BACKGROUND OF THE INVENTION

1. Field of the Invention

The present invention relates generally to a minimum leading edge blanking (MLEB) signal generator, and more particularly, to an MLEB signal generator and a method for generating an MLEB signal adapted for blanking a peak high voltage signal for avoiding a misoperation.

2. The Prior Arts

Recently, high performance chips lead the trend of further development, and the chip processing technologies are being developed toward smaller sizes, e.g., from 0.8 μm to 0.18 μm, 0.13 μm, or even 65 nm. Correspondingly, different chip processing technologies requires particular operation voltages, e.g., 5.0V, 3.3V, 1.8V, or 1.2V. Accordingly, a power source management chip which is capable of converting different input voltages into a suitable output power or output voltage is often employed in the chip processing technologies.

In a typical power source management chip, a buck DC-DC converter is often used for providing an output voltage lower than the input voltage, e.g., converting 5.0V to 3.3V, or converting 3.3V to 1.8V. An application circuit of the buck DC-DC converter often requires to employ an external inductor. By adaptively switching the current provided to the external inductor, a stable output voltage can be outputted, while the output power is maintained in a proper range, thus avoiding the affection caused by a load effect.

The electric operation principle and structure of a current mode buck DC-DC converter can be learnt by referring to the teaching article issued on the following website http://www-.maxim-ic.com/appnotes.cfm/an_pk/2031/, which is provided by Maxim Integrated Products Co.

The function of a conventional current mode buck DC-DC converter is to be schematically illustrated herebelow. FIG. 1 is a block diagram for illustrating a part of functions of the conventional current mode buck DC-DC converter. Referring to FIG. 1, the architecture as shown in FIG. 1 is similar to the examples given in the above-cited website, while only a part of circuitry blocks are illustrated. As shown in FIG. 1, the current mode buck DC-DC converter includes an error amplifier 10, a current comparator 20, a switching unit 30, a driving unit 40, and a current sensing unit 50, and provides an output power source having a suitable output voltage to a load 60.

The error amplifier 10 receives a reference voltage signal Vref and a feedback signal Vfb. The error amplifier 10 are respectively coupled to a negative input terminal and a positive input terminal of the error amplifier, and amplifies a difference between the reference voltage signal Vref and the feedback signal Vfb to obtain an error amplification signal Vea. The current comparator receives the error amplification signal Vea and a current sensing signal Vcs, and is respectively coupled to a negative input terminal and a positive input terminal of the current comparator 20, and generates a reset signal Vrst.

The switching unit 30 can be an RS flip-flop. The switching unit receives an oscillation signal Vosc and the reset signal Vrst, and is respectively coupled to a setting terminal S and a reset terminal R. The switching signal 30 has a positive output terminal Q and a negative output terminal Q', and generates a positive switching signal Sin at the positive output terminal Q and generates a negative switching signal Sin' at the negative output terminal Q'. The driving unit 40 receives the positive switching signal Sin and the negative switching signal Sin', and generates an output signal. The current sensing unit 50 receives the output signal from the driving unit 40, and generates the current sensing signal Vcs.

The driving unit 40 can include two power transistors (not shown in the drawing). The gates of the two power transistors are respectively coupled to the positive switching signal Sin and the negative switching signal Sin'. The drains of the two power transistors are coupled to the load 60 for providing the input power source. In such a way, the input power source of the load 60 can be controlled by the positive switching signal Sin and the negative switching signal Sin', and the output signal of the driving unit 40 is related to the current flowing through the load 60.

Generally, the reference voltage signal Vref is a stable voltage which is relatively temperature-irrelevant and provided by a reference circuit. Specifically, the reference voltage signal Vref is usually a 1.22V voltage generated by a bandgap circuit. The feedback signal Vfb is adapted for providing a feedback mechanism, for stabilizing the input power source to be provided to the load 60. Generally, two resistances are serially connected together and are then parallel coupled to the power source input terminal of the load 60, and a voltage at where the two resistances are serially connected is taken serving as the feedback signal Vfb. The oscillation signal Vosc is a square wave or an oblique wave having a constant frequency. The oscillation signal Vosc is typically generated by an oscillator.

FIG. 2 is a schematic diagram illustrating an operation wave of a conventional buck DC-DC converter. As shown in FIG. 2, at the beginning, the positive switching signal Sin is at a high level. When the current sensing signal Vcs is greater than the error amplification signal Vea, i.e., the first point A in FIG. 2, the current comparator 20 generates a reset signal Vrst at a high level, and correspondingly the positive switching signal is switched to a low level. When the driving unit 40 receives the positive switching signal Sin at low level (and the negative switching signal Sin' at high level), and it refreshes the current sensing signal Vcs to a low voltage, e.g., 0V or substantially 0V, via the current sensing unit 50.

However, the current sensing signal Vcs often has a peak voltage, as shown as the second point B in FIG. 3. Along with the timeline, the current sensing signal Vcs drops down to the first voltage V1 at the third point C, and then rises up. In this case, as shown I FIG. 3, the peak voltage at the second point B is greater than the error amplification signal Vea, the current comparator 20 outputs the high level reset signal Vrst in advance. Then, the switching unit 30 generates a low level positive switching signal Sin, and then the driving unit 40 and the current sensing unit 50 refresh the current sensing signal Vcs to a low voltage, such that an average power at the load is reduced down, even to zero.

In accordance with a solution provided by the conventional technology, a leading edge blanking (LEB) signal having a fixed width W1 is introduced. Specifically, within the width W1 of the LEB signal, the switching unit 30 does not generate the low level positive switching signal Sin, or the driving signal 40 and the current sensing unit 50 neglect the low level positive switching signal Sin generated by the switching unit 30, so that the previous electric operation is maintained. In such a way, the misoperation of refreshing the current sensing signal Vcs to the low voltage in advance can be avoided. As shown in FIG. 3, at the edge of the width W1 of the LEB signal, i.e., the fourth point D, the current sensing signal Vcs has a voltage smaller than the error amplification signal Vea. As such, the solution can solve the foregoing difficulty.

However, if there is a residue of the peak current of the current sensing signal Vcs greater than the error amplification signal Vea remained outside of the width of the LEB signal, the switching unit 30, the driving unit 40, or the current sensing unit 50 would still start the misoperation of refreshing the current sensing signal Vcs to the low voltage in advance. As shown by the dashed line waveform of the current sensing signal Vcs, at the edge of the width W1 of the LEB signal, i.e., the fifth point E, the voltage of the current sensing signal Vcs is greater than the error amplification signal Vea. As such, at the fifth point E, the switching unit 30, the driving unit 40, or the current sensing unit 50 would still start the misoperation.

Although an LEB signal having a widened width W1 can be used to solve the foregoing difficulty, it may exceed the time point that the current sensing signal Vcs is equal to the error amplification signal Vea, thus causing a delay of refreshing the current sensing signal Vcs, which may further cause the load power exceeding the predetermined value. The LEB signal having a widened width W1 may even cause a failure of refreshing the current sensing signal Vcs to the low voltage, so that the current sensing signal Vcs remains rising, and the switching function is disabled. Such a malfunction often leads to a permanent damage to the buck DC-DC converter.

Accordingly, an MLEB signal generator is desired for generating an optimal adjustable blanking width, so as to assure that the peak voltage won't cause any misoperation, and the current sensing signal Vcs can be regularly refreshed to the low voltage.

SUMMARY OF THE INVENTION

Accordingly, a primary objective of the present invention is to provide a minimum leading edge blanking (MLEB) signal generator, for receiving an externally inputted error amplification signal and a current sensing signal, and correspondingly generating an MLEB signal. The MLEB signal generator includes a buck unit and a signal generation unit. The buck unit receives the error amplification signal, and generates a reference blanking signal. The reference blanking signal has a voltage lower than a voltage of the error amplification signal. The signal generation unit receives the reference blanking signal, and generates the MLEB signal according to the current sensing signal. When the current sensing signal is equal to the reference blanking signal, the MLEB signal changes its voltage level, e.g., from high level to low level or from low level to high level. As such, the width of the MLEB signal is a time width of the high level or low level of the MLEB signal before the voltage level of the MLEB signal changes. The MLEB is provided to an external unit, such that within the width of the MLEB, the external unit neglects a peak voltage in existing in the current sensing signal. When the voltage of the current sensing signal is greater than the voltage of the error amplification signal, the voltage of the current sensing signal is correctly refreshed to a low voltage, e.g., 0V. In such a way, the external unit can be prevented from misoperation caused by the peak voltage, thus improving the electric performance in its entirety.

Another objective of the present invention is to provide a method for generating an MLEB signal. According to the method, a buck unit is used to receive an error amplification signal and generate a reference blanking signal. Then, a signal generation unit is used to receive the reference blanking signal, and generate the MLEB signal according to a current sensing signal. The MLEB is provided to an external unit, such that the external unit can be prevented from misoperation caused by the peak voltage of the current sensing signal.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
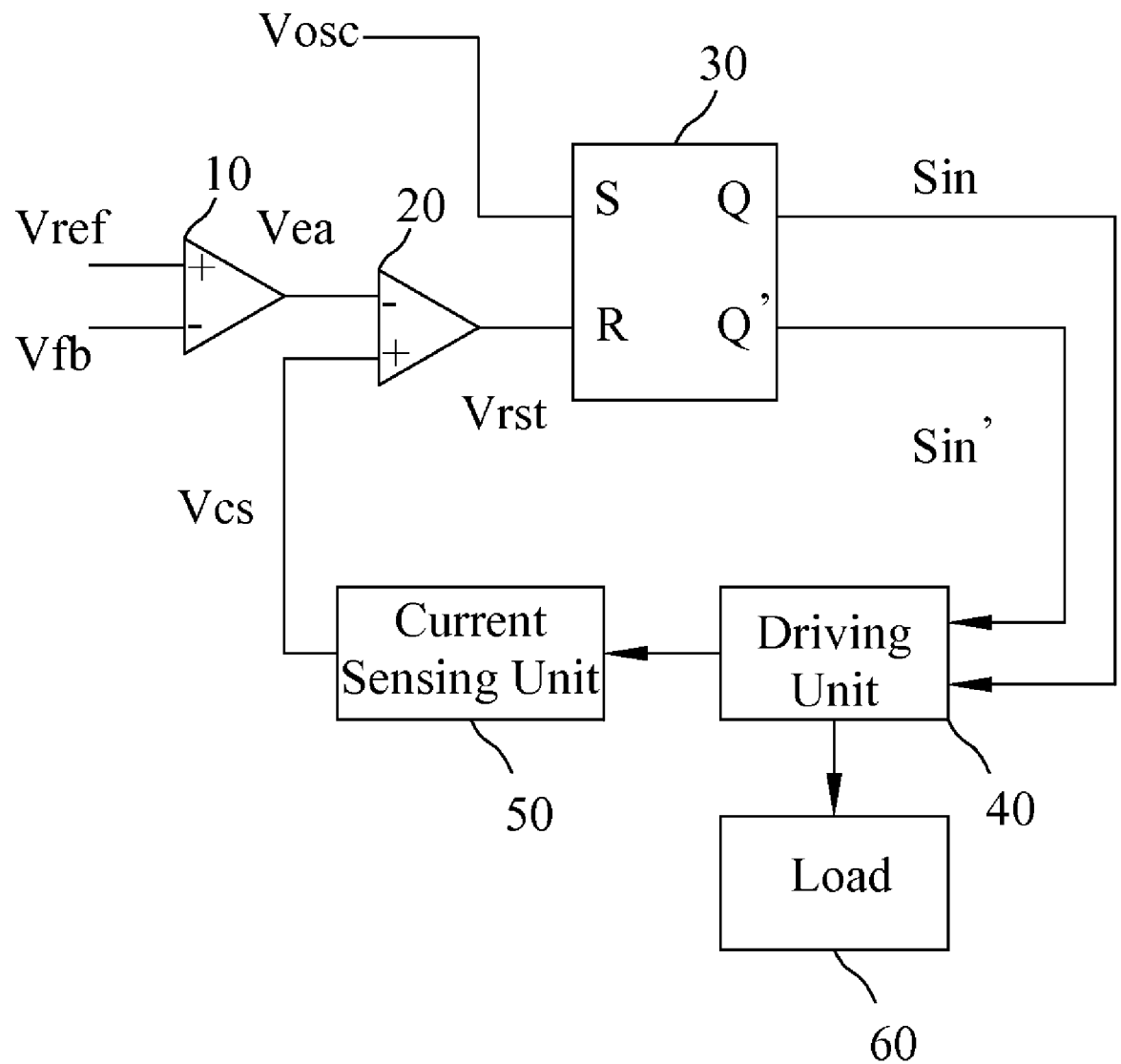
FIG. 1 is a block diagram for illustrating a part of functions of the conventional current mode buck DC-DC converter.
Figure 2:
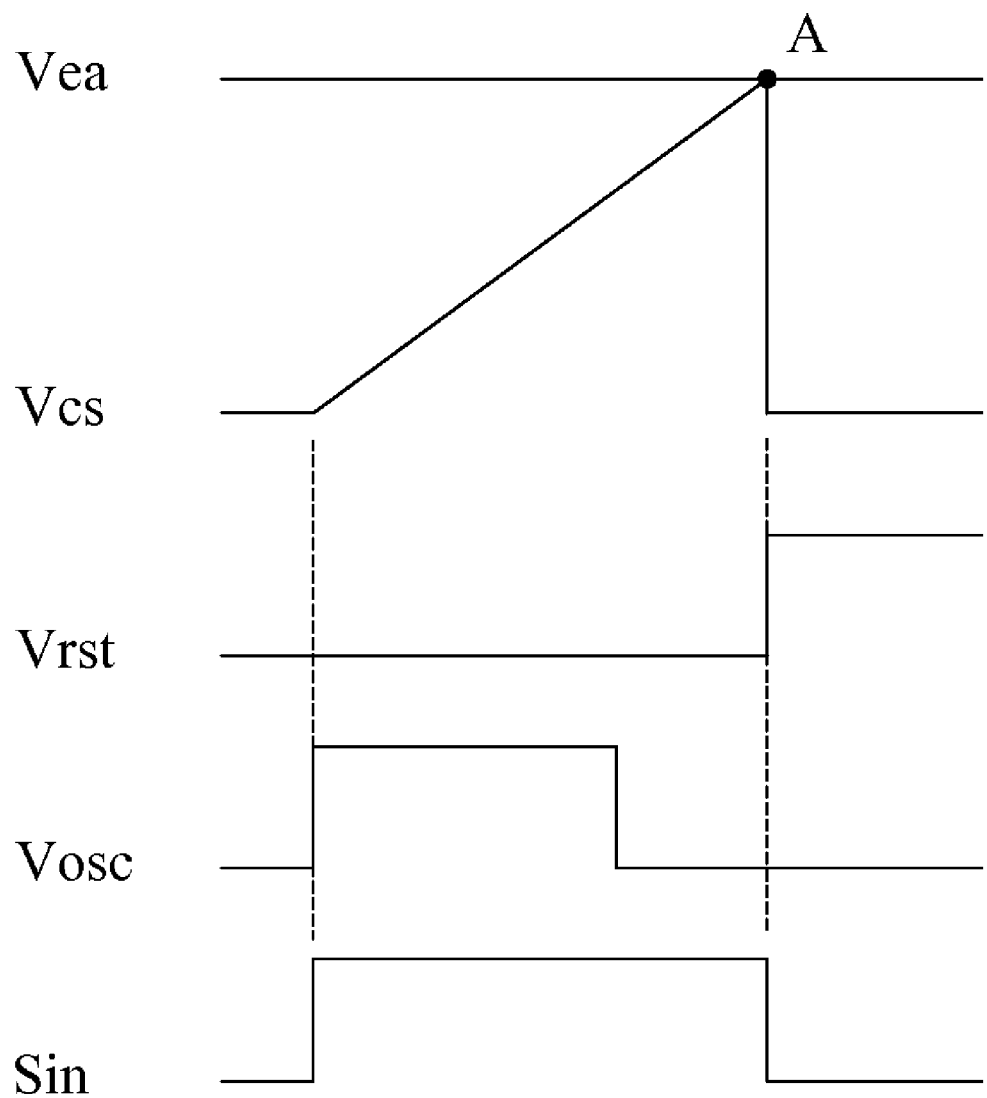
FIG. 2 is a schematic diagram illustrating an operation wave of a conventional buck DC-DC converter.
Figure 3:
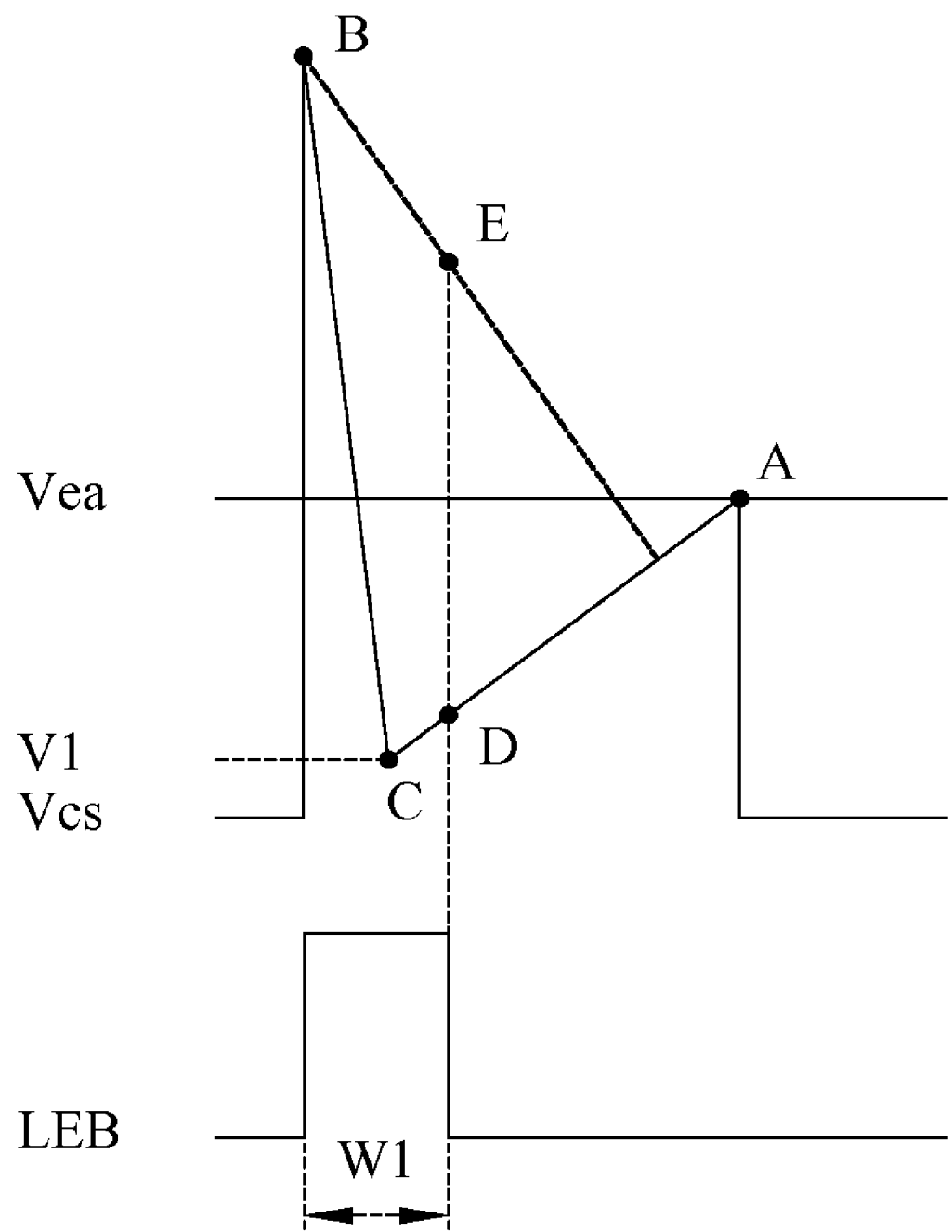
FIG. 3 is a schematic diagram illustrating another operation wave of the conventional buck DC-DC converter.

The accompanying drawings are included to provide a further understanding of the invention, and are incorporated in and constitute a part of this specification. The drawing illustrates embodiments of the invention and, together with the description, serves to explain the principles of the invention.

According to a first embodiment of the present invention, a minimum leading edge blanking (MLEB) signal generator is provided, and according to a second embodiment of the present invention, a method for generating an MLEB signal is provided. At first, the structure and electric operation of the MLEB signal generator is to be illustrated herebelow in the first embodiment.

Figure 4:
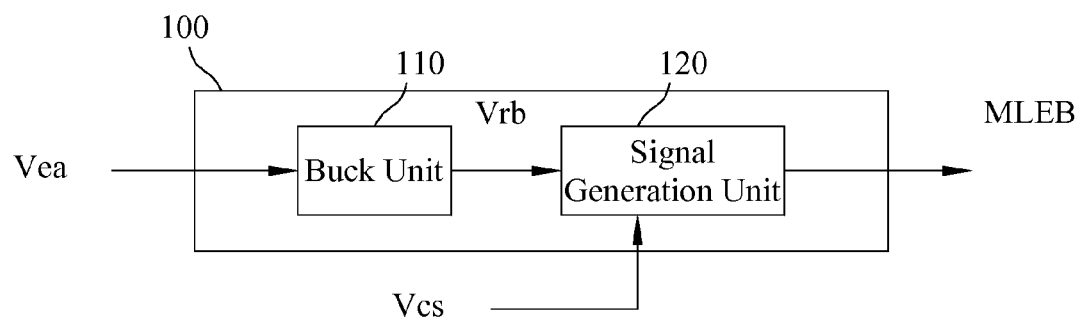
FIG. 4 is a schematic diagram illustrating MLEB generator according to an embodiment of the present invention.

FIG. 4 is a schematic diagram illustrating MLEB generator according to an embodiment of the present invention. Referring to FIG. 4, an MLEB signal generator 100 receives an error amplification signal Vea and a current sensing signal Vcs for generating the MLEB signal MLEB. The MLEB signal generator 100 includes a buck unit 110 and a signal generation unit 120. The buck unit 110 receives the error amplification signal Vea, and generates a reference blanking signal Vrb. The signal generation unit 120 receives the reference blanking signal Vrb, and generates the MLEB signal MLEB according to the current sensing signal Vcs.

Figure 5:
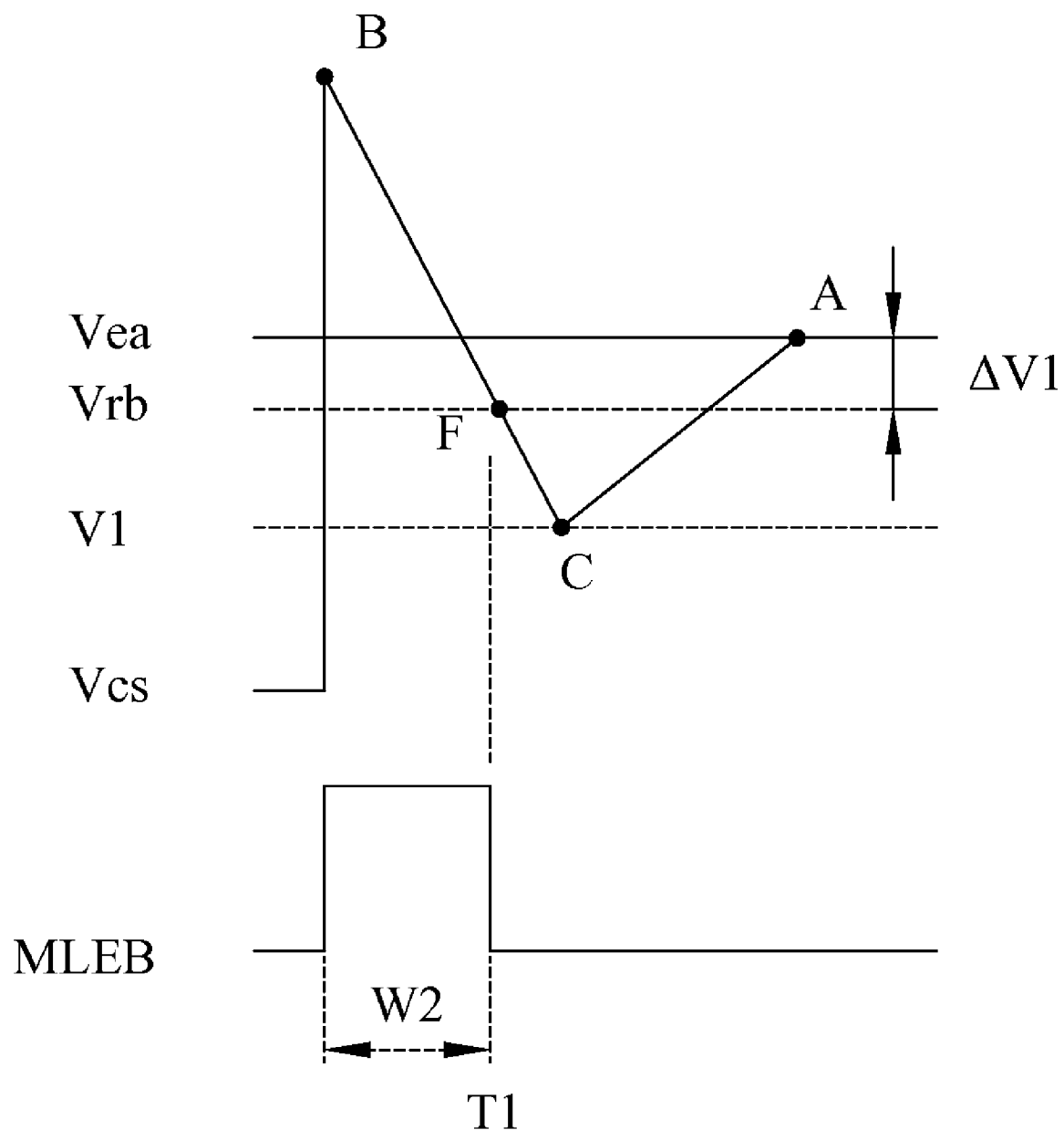
FIG. 5 is a schematic diagram illustrating an operation wave of the MLEB generator of the present invention.

FIG. 5 is a schematic diagram illustrating an operation wave of the MLEB generator of the present invention. As shown in FIG. 5, the voltage of the reference blanking signal Vrb is smaller than the voltage of the error amplification signal Vea, and the difference that the voltage of the reference blanking signal Vrb is smaller than the voltage of the error amplification signal Vea is $\Delta V1$. The current sensing signal Vcs has a peak voltage at the beginning, i.e., the second point B of FIG. 5. The peak voltage of the current sensing signal Vcs at the second point B is greater than the voltage of the error amplification signal Vea. Then, the voltage of the current sensing signal Vcs drops down to a first voltage V1 (i.e., at the third point C of FIG. 5) along the timeline. During the process that the voltage of the current sensing signal Vcs drops down, at a first time T1, the voltage of the current sensing signal Vcs overlaps with the reference blanking signal Vrb at a sixth point F. Turning from the third point C, the voltage of the current sensing signal Vcs rises up along the timeline, and overlaps with the error amplification signal Vea at the first point A.

The signal generation unit 120 includes a comparator unit having a positive input terminal and a negative input terminal. The positive input terminal of the comparator unit is coupled to the current sensing signal Vcs, and the negative input terminal of the comparator unit is coupled to the reference blanking signal Vrb. As such, as shown as the waveform of FIG. 5, the voltage of the MLEB signal MLEB generated by the signal generation unit 120 is at a high level at the beginning, and changes to a low level at the first time T1. As such, the MLEB signal MLEB is maintained at the high level with a width W2.

It should be noted that the present invention can also alternatively select an opposite level as another embodiment, in that the negative input terminal of the comparator unit is coupled to the current sensing signal Vcs and the positive input terminal of the comparator unit is coupled to the reference blanking signal Vrb. In this case, the voltage of the MLEB signal MLEB generated by the signal generation unit 120 is at a low level at the beginning, and changes to a high level at the first time T1. As such, the MLEB signal MLEB is maintained at the low level with a width W2.

The current sensing signal Vcs is generated by an external unit (not shown in the drawings). When the voltage of the current sensing signal Vcs is greater than the voltage of the error amplification signal Vea, i.e., at the first point A, the external unit refreshes the voltage of the current sensing signal Vcs to a first low voltage. The first low voltage can be 0V or substantially 0V.

Therefore, the present invention is featured in that the MLEB signal MLEB is provided to the external unit, so that the external unit utilizes the MLEB signal for blanking a part of the current sensing signal Vcs that exceeds the error amplification signal Vea caused by the peak voltage. In such a way, misoperation of the external unit which causes the voltage of the current sensing signal Vcs to be refreshed to the first low voltage in advance can be prevented. In other words, within the width W2 of the MLEB signal, the external unit won't refresh the voltage of the current sensing signal Vcs even when the voltage of the current sensing signal Vcs is greater than the voltage of the error amplification signal Vea.

Further, the present invention is further featured in that the width W2 of the MLEB signal MLEB is not a constant value. Instead, it is determined by the reference blanking signal Vrb. The reference blanking signal Vrb is equal to the voltage of the error amplification signal Vea minus the first voltage difference $\Delta V1$. Therefore, the present invention can adjust the optimal width W2 as desired by adjusting the first voltage difference $\Delta V1$. As such, the width W2 won't be too small to blank the effect of the peak voltage, and won't be too large so that the entire electric efficiency is reduced.

The MLEB signal generator is particularly suitable for being applied in a current mode buck DC-DC converter, for blanking the peak voltage caused by switching a current flowing through an external inductor. However, it is worth mentioning that the MLEB signal generator can also be applied in other DC-DC converters, such as voltage mode buck DC-DC converter, current mode boost DC-DC converter, voltage mode boost DC-DC converter, or any other fields demanding to blanking a peak voltage.

The method for generating the MLEB signal is to be illustrated in the second embodiment herebelow.

Figure 6:
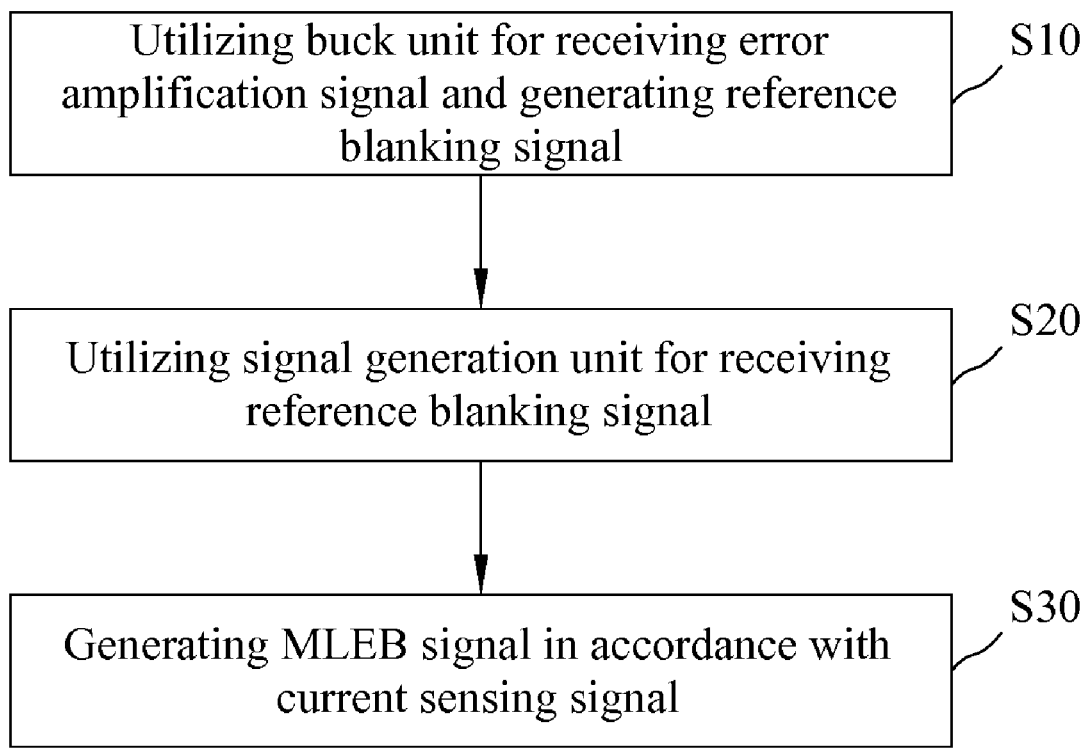
FIG. 6 is a flow chart illustrating a method of generating an MLEB signal according to an embodiment of the present invention.

FIG. 6 is a flow chart illustrating a method of generating an MLEB signal according to an embodiment of the present invention. Referring to FIG. 6, the flow starts from step S10.

In step S10, a buck unit receives an error amplification signal and generates a reference blanking signal. The voltage of the reference blanking signal is smaller than the voltage of the error amplification signal, and a difference between the voltage of the reference blanking signal and the voltage of the error amplification signal is a first voltage difference. Then, the flow enters step S20, in which a signal generation unit receives the reference blanking signal. Then, the flow enters step S30, in which, the MLEB signal is generated in accordance with the current sensing signal.

The buck unit and the signal generation unit of the second embodiment are similar as exemplified in the first embodiment, and the structure and the electric operation of the buck unit and the signal generation unit can be learnt by referring to the first embodiment, and are not to be iterated hereby. As such, the MLEB signal obtained in accordance with the method of the second embodiment can be provided for the external unit for blanking any possible peak voltage in the current sensing signal, so as to assure the regular electric operation of the external unit.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A minimum leading edge blanking (MLEB) signal generator, adapted for receiving an externally inputted error amplification signal and a current sensing signal, for generating an MLEB signal, the MLEB signal generator comprising:

a buck unit, receiving the error amplification signal, and generating a reference blanking signal, wherein a voltage of the reference blanking signal is smaller than a voltage of the error amplification signal, and a difference between the voltage of the reference blanking signal and the voltage of the error amplification signal is a first voltage difference; and a signal generation unit, receiving the reference blanking signal, and generating the MLEB signal according to the current sensing signal, wherein the MLEB signal has a width, wherein at a beginning time, the current sensing signal has a peak voltage at a high level, and the current sensing signal drops down to a first voltage along a timeline, and then the current sensing signal rises up from the first voltage along the timeline, wherein a time point at which the voltage of the current sensing signal is equal to the voltage of the reference blanking signal is referred as a first time, and a time length from the beginning time to the first time is the width of the MLEB signal, wherein the voltage of the current sensing signal is smaller than the error amplification signal during the time length, and when the voltage of the current sensing signal is greater than the voltage of the error amplification signal at a time outside the width of the MLEB signal, the current sensing signal is refreshed by an external unit to a first low voltage, wherein the first low voltage is lower than the voltage of the error amplification signal.

2. The MLEB signal generator as claimed in claim 1, wherein the signal generation unit comprises a comparator unit having a positive input terminal and a negative input terminal, wherein the positive input terminal of the comparator unit is coupled to the current sensing signal, and the negative input terminal of the comparator unit is coupled to the reference blanking signal for comparing the current sensing signal with the reference blanking signal, wherein at the beginning, the comparator unit generates an MLEB signal at a high level, and when the voltage of the current sensing signal is equal to the voltage of the reference blanking signal, the comparator unit generates an MLEB signal at a low level, wherein the width of the MLEB signal is a time length during which the voltage of the MLEB signal is at the high level.

3. The MLEB signal generator as claimed in claim 1, wherein the signal generation unit comprises a comparator unit having a negative input terminal and a positive input terminal, wherein the negative input terminal of the comparator unit is coupled to the current sensing signal, and the positive input terminal of the comparator unit is coupled to the reference blanking signal for comparing the current sensing signal with the reference blanking signal, wherein at the beginning, the comparator unit generates an MLEB signal at a low level, and when the voltage of the current sensing signal is equal to the voltage of the reference blanking signal, the comparator unit generates an MLEB signal at a high level, wherein the width of the MLEB signal is a time length during which the voltage of the MLEB signal is at the low level.

4. The MLEB signal generator as claimed in claim 1, wherein the first low voltage is 0V.

5. A method for generating a minimum leading edge blanking (MLEB) signal, comprising:
   utilizing a buck unit for receiving an error amplification signal, and generating a reference blanking signal, wherein a voltage of the reference blanking signal is smaller than a voltage of the error amplification signal, and a difference between the voltage of the reference blanking signal and the voltage of the error amplification signal is a first voltage difference; and
   utilizing a signal generation unit for receiving the reference blanking signal, and generating the MLEB signal according to a current sensing signal, wherein the MLEB signal has a width,
   wherein at a beginning time, the current sensing signal has a peak voltage at a high level, and the current sensing signal drops down to a first voltage along a timeline, and then the current sensing signal rises up from the first voltage along the timeline, wherein a time point at which the voltage of the current sensing signal is equal to the voltage of the reference blanking signal is referred as a first time, and a time length from the beginning time to the first time is the width of the MLEB signal, wherein the voltage of the current sensing signal is smaller than the error amplification signal during the time length, and when the voltage of the current sensing signal is greater than the voltage of the error amplification signal at a time outside the width of the MLEB signal, the current sensing signal is refreshed by an external unit to a first low voltage, wherein the first low voltage is lower than the voltage of the error amplification signal.

6. The method as claimed in claim 5, wherein the signal generation unit comprises a comparator unit having a positive input terminal and a negative input terminal, wherein the positive input terminal of the comparator unit is coupled to the current sensing signal, and the negative input terminal of the comparator unit is coupled to the reference blanking signal for comparing the current sensing signal with the reference blanking signal, wherein at the beginning, the comparator unit generates an MLEB signal at a high level, and when the voltage of the current sensing signal is equal to the voltage of the reference blanking signal, the comparator unit generates an MLEB signal at a low level, wherein the width of the MLEB signal is a time length during which the voltage of the MLEB signal is at the high level.

7. The method as claimed in claim 5, wherein the signal generation unit comprises a comparator unit having a negative input terminal and a positive input terminal, wherein the negative input terminal of the comparator unit is coupled to the current sensing signal, and the positive input terminal of the comparator unit is coupled to the reference blanking signal for comparing the current sensing signal with the reference blanking signal, wherein at the beginning, the comparator unit generates an MLEB signal at a low level, and when the voltage of the current sensing signal is equal to the voltage of the reference blanking signal, the comparator unit generates an MLEB signal at a high level, wherein the width of the MLEB signal is a time length during which the voltage of the MLEB signal is at the low level.

8. The method as claimed in claim 5, wherein the first low voltage is 0V.

* * * * *